United States Patent
Singer et al.

(10) Patent No.: US 12,028,997 B2
(45) Date of Patent: Jul. 2, 2024

(54) ROTATING LID FOR MODULE COOLER

(71) Applicant: INTERNATIONAL BUSINESS MACHINES CORPORATION, Armonk, NY (US)

(72) Inventors: Noah Singer, White Plains, NY (US); Jeffrey Allen Zitz, Poughkeepsie, NY (US); Mark D. Schultz, Ossining, NY (US); John Torok, Poughkeepsie, NY (US); William L. Brodsky, Binghamton, NY (US); Yuet-Ying Yu, Hopewell Junction, NY (US); Shawn Canfield, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 17/304,855

(22) Filed: Jun. 28, 2021

(65) Prior Publication Data

US 2022/0418134 A1    Dec. 29, 2022

(51) Int. Cl.
    H05K 5/03    (2006.01)
    H05K 7/20    (2006.01)

(52) U.S. Cl.
    CPC .......... *H05K 5/03* (2013.01); *H05K 7/20254* (2013.01)

(58) Field of Classification Search
    CPC .... H05K 5/03; H05K 7/20254; H05K 7/1061; H05K 7/1007; H05K 7/1053; H05K 7/10; H05K 7/00; H05K 7/1023; H05K 7/1402; H05K 7/20
    See application file for complete search history.

(56) References Cited

U.S. PATENT DOCUMENTS

| | | | |
|---|---|---|---|
| 5,533,256 A * | 7/1996 | Call | H01L 23/3675 174/16.3 |
| 5,986,882 A | 11/1999 | Ekrot | |
| 6,086,387 A * | 7/2000 | Gallagher | G01R 1/0483 439/71 |
| 6,377,452 B1 | 4/2002 | Sasaki | |
| 6,932,622 B2 | 8/2005 | Liao | |
| 6,992,382 B2 * | 1/2006 | Chrysler | H01L 23/473 361/689 |
| 7,029,310 B1 * | 4/2006 | Perez | H05K 7/1053 439/73 |
| 7,030,638 B2 * | 4/2006 | Stutzman | G01R 1/0466 324/750.05 |
| 7,147,483 B1 | 12/2006 | Ju | |
| 7,149,087 B2 | 12/2006 | Wilson | |
| 7,239,518 B2 | 7/2007 | Yang | |

(Continued)

OTHER PUBLICATIONS

IBM: List of IBM Patents or Patent Applications Treated as Related (Appendix P), Aug. 24, 2021, 2 pages.

(Continued)

*Primary Examiner* — Abhishek M Rathod
(74) *Attorney, Agent, or Firm* — L. Jeffrey Kelly

(57) ABSTRACT

An electronic assembly is provided. The electronic assembly may include an electronic module mounted to a laminate, a cooling apparatus directly above the module, a single thermal interface material positioned between and directly contacting the module and the cooling apparatus, and a rotating cover rotatably attached to a top frame secured to the laminate, wherein the rotating cover includes an open position and a closed position.

20 Claims, 9 Drawing Sheets

(56) References Cited

U.S. PATENT DOCUMENTS

| | | | | |
|---|---|---|---|---|
| 7,272,006 B2* | 9/2007 | Mongia | H01L 23/473 | 257/E23.098 |
| 7,480,146 B2* | 1/2009 | Coleman | H01L 23/4093 | 165/185 |
| 7,499,279 B2* | 3/2009 | Campbell | H01L 23/473 | 257/714 |
| 7,562,617 B2* | 7/2009 | Di Stefano | G01R 1/0433 | 92/97 |
| 7,632,115 B1 | 12/2009 | Polnyi | | |
| 7,677,912 B2* | 3/2010 | Zhang | H05K 7/1053 | 439/331 |
| 7,749,014 B2 | 7/2010 | Chiang | | |
| 7,824,188 B2* | 11/2010 | Yokoyama | H05K 7/1061 | 439/73 |
| 7,826,229 B2* | 11/2010 | Cromwell | H05K 7/2049 | 165/185 |
| 7,864,537 B2* | 1/2011 | Kim | G01R 31/2808 | 257/718 |
| 7,905,106 B2 | 3/2011 | Attlesey | | |
| 7,916,483 B2 | 3/2011 | Campbell | | |
| 7,946,881 B2* | 5/2011 | Hsieh | G01R 1/0458 | 439/331 |
| 8,144,469 B2* | 3/2012 | Kyle | H05K 7/1061 | 174/16.3 |
| 8,172,597 B1 | 5/2012 | Terhune, IV | | |
| 8,279,606 B2* | 10/2012 | Kyle | H01R 12/00 | 257/713 |
| 8,562,367 B2* | 10/2013 | Yokoyama | H01R 12/714 | 439/73 |
| 8,760,870 B2 | 6/2014 | Yamamoto | | |
| 8,816,496 B2* | 8/2014 | Lee | H01L 23/32 | 257/722 |
| 8,834,191 B2 | 9/2014 | Yeh | | |
| 8,979,565 B2 | 3/2015 | Yeh | | |
| 9,054,473 B2* | 6/2015 | Kyle | H01R 12/00 | |
| 9,192,070 B2 | 11/2015 | Tan | | |
| 9,214,754 B2 | 12/2015 | Yeh | | |
| 9,245,818 B2* | 1/2016 | Boyd | H05K 3/301 | |
| 9,270,035 B2 | 2/2016 | Yeh | | |
| 9,270,050 B2 | 2/2016 | Liu | | |
| 9,500,417 B2* | 11/2016 | Lin | F28F 9/26 | |
| 9,590,332 B2 | 3/2017 | Peng | | |
| 9,705,264 B2* | 7/2017 | Kyle | H01R 12/7076 | |
| 9,730,351 B2 | 8/2017 | Hsu | | |
| 9,848,510 B2* | 12/2017 | Krithivasan | H01L 23/32 | |
| 9,853,380 B2* | 12/2017 | Narumi | H01R 12/7058 | |
| 9,960,513 B1* | 5/2018 | Peng | H05K 7/1007 | |
| 10,111,365 B1* | 10/2018 | Junkins | G11B 33/1426 | |
| 10,466,273 B1* | 11/2019 | Hwang | H01R 12/716 | |
| 10,541,487 B2* | 1/2020 | Wu | H01R 12/7076 | |
| 10,575,438 B1* | 2/2020 | Yatskov | H01L 23/473 | |
| 10,674,624 B2 | 6/2020 | Wu | | |
| 10,741,952 B2 | 8/2020 | Wu | | |
| 10,874,032 B2* | 12/2020 | Leigh | H05K 7/20636 | |
| 10,925,186 B2* | 2/2021 | Selvidge | H05K 7/20509 | |
| 11,244,882 B2* | 2/2022 | Hachuda | H01R 13/639 | |
| 2005/0208813 A1* | 9/2005 | Trout | H01R 13/2442 | 439/326 |
| 2006/0050483 A1* | 3/2006 | Wilson | H01L 23/473 | 361/689 |
| 2008/0045048 A1 | 2/2008 | Ma | | |
| 2008/0130221 A1 | 6/2008 | Varadarajan | | |
| 2008/0266799 A1 | 10/2008 | Campbell | | |
| 2009/0021917 A1* | 1/2009 | Floyd | H01L 23/467 | 29/832 |
| 2009/0213541 A1* | 8/2009 | Butterbaugh | H01L 23/473 | 361/689 |
| 2010/0103620 A1 | 4/2010 | Campbell | | |
| 2010/0130048 A1 | 5/2010 | Fan | | |
| 2010/0291793 A1* | 11/2010 | Hsieh | G01R 1/0458 | 439/487 |
| 2011/0287639 A1 | 11/2011 | Hsu | | |
| 2013/0342997 A1* | 12/2013 | Yeh | H01L 23/4093 | 361/704 |
| 2014/0092573 A1 | 4/2014 | Llapitan | | |
| 2014/0199873 A1 | 7/2014 | Liu | | |
| 2019/0069429 A1 | 2/2019 | Lu | | |
| 2019/0252813 A1* | 8/2019 | Wu | H01R 12/88 | |
| 2020/0260615 A1 | 8/2020 | Leigh | | |
| 2020/0400786 A1 | 12/2020 | Kakimoto | | |

OTHER PUBLICATIONS

Pending U.S. Appl. No. 17/304,856, filed Jun. 28, 2021, entitled: "Temporary Removable Module Lid", 23 pages.

* cited by examiner

ROTATING LID FOR MODULE COOLER

BACKGROUND

The present invention generally relates to cooling of computing system environments, and more particularly to a cold plate retention mechanism enabling easy removal of the cold plate while simultaneously offering increased protection for the module or chip.

The industry trend has been to continuously increase the number of electronic components inside computing systems and the power consumed by existing components. Given the limited footprint of many computing systems, a continuous increase in the number of heat generating components creates challenging heat dissipation issues. These issues, if not dealt with adequately, can harm the structural and data integrity of the computer system, making the effect felt both at a system and module level.

In recent years, direct or indirect liquid cooling has become a more attractive option for the designers of computing systems. Liquid cooling has been shown to be substantially less burdensome both in terms of energy costs and resource allocations, especially for use in data centers.

Traditionally, indirect liquid cooling techniques incorporate a cold plate disposed adjacent to a circuit module or chip. Cooling liquid is provided inside the cold plate from a coolant supply and circulated by entering an inlet port and exiting through an outlet port. Heat from the electronic components (module/chip) is conducted to the mating surface of the cold plate and then transferred to the cooling liquid. In such arrangements, the cooling liquid would be completely sealed off from the electronic components and only used to provide indirect liquid cooling to the electronic components.

SUMMARY

According to one embodiment of the present invention, an electronic assembly is provided. The electronic assembly may include an electronic module mounted to a laminate, a cooling apparatus directly above the module, a single thermal interface material positioned between and directly contacting the module and the cooling apparatus, and a rotating cover rotatably attached to a top frame secured to the laminate, wherein the rotating cover includes an open position and a closed position.

According to another embodiment, an electronic assembly is provided. The electronic assembly may include an electronic module mounted to a laminate, a cooling apparatus directly above the module, a single thermal interface material positioned between and directly contacting the module and the cooling apparatus, and a rotating cover rotatably attached to a top frame secured to the laminate, wherein the top frame surrounds all sides of both the module and the cooling apparatus.

According to another embodiment, an electronic assembly is provided. The electronic assembly may include an electronic module mounted to a laminate, a cooling apparatus directly above the module, a single thermal interface material positioned between and directly contacting the module and the cooling apparatus, and a rotating cover rotatably attached to the laminate with pivot features.

BRIEF DESCRIPTION OF THE DRAWINGS

The following detailed description, given by way of example and not intended to limit the invention solely thereto, will best be appreciated in conjunction with the accompanying drawings, in which.

Figure 1:
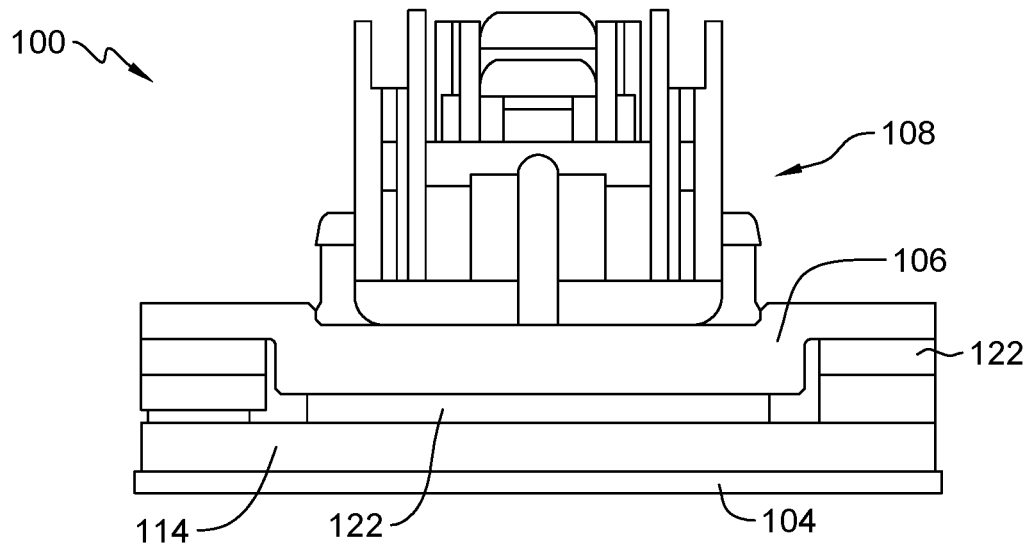
FIG. 1 is a side view of a structure according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

System performance is heavily dependent on thermal management. Current thermal management strategies use a lidded module requiring two thermal interface material (hereinafter "TIM") interfaces. A first TIM interface exists between electronic components, for example processor(s), and the lid, and a second TIM interface exists between the module lid and the cooling apparatus or cold plate. In such cases, cooling of the module requires heat to transfer from the electronic components (ie processors) through the first TIM interface to the module lid, and then transfer from the module lid through the second TIM into the cooling apparatus. Cooling performance and efficiency decreases as the number of material interfaces increase. As such, a cooling arrangement with fewer TIM interfaces would have better cooling performance and cool the module more efficiently than conventional cooling arrangements with two or more TIM interfaces. Embodiments of the present invention eliminate the module lid and disclose a cooling arrangement with only one TIM interface.

Currently, conventional thermal management solutions used with a lidded module will not support anticipated cooling demands of future system power levels at desired operating frequency and chip yield. Eliminating the module lid in accordance with embodiments of the present embodiment is expected to improve cooling performance and efficiency and thereby meet the anticipated cooling demands of future systems. Eliminating the module lid and using a single TIM interface enables enhanced processor performance by reducing the thermal resistance. Eliminating the module lid in accordance with embodiments of the present invention further requires additional measures to physically protect the module during installation and maintenance, and thus requires a novel solution. As such there is a need for a structure that enables a removeable cooling apparatus a single TIM interface all while providing the necessary protection to the modules to prevent cracking or damage.

The present invention generally relates to cooling of computing system environments, and more particularly to a cold plate retention mechanism enabling easy removal of the cold plate while simultaneously offering increase protection for the processor or chip. Exemplary embodiments of a cold plate retention mechanism are described in detail below by referring to the accompanying drawings in FIGS. 1 to 17. Those skilled in the art will readily appreciate that the detailed description given herein with respect to these figures is for explanatory purposes as the invention extends beyond these limited embodiments.

Figure 2:
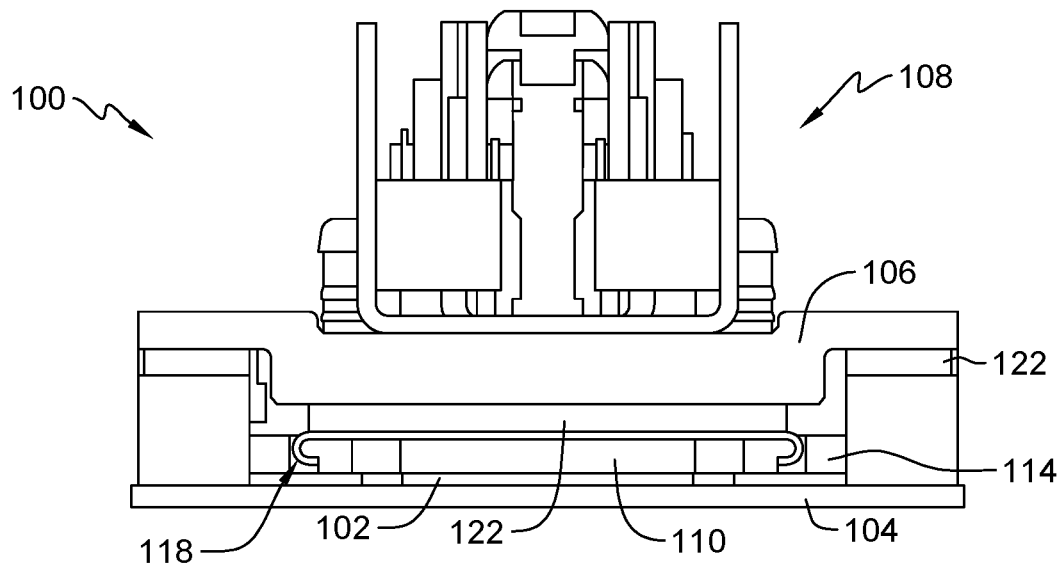
FIG. 2 is a cross-sectional view of the structure illustrated in FIG. 1 according to an exemplary embodiment.
Figure 3:
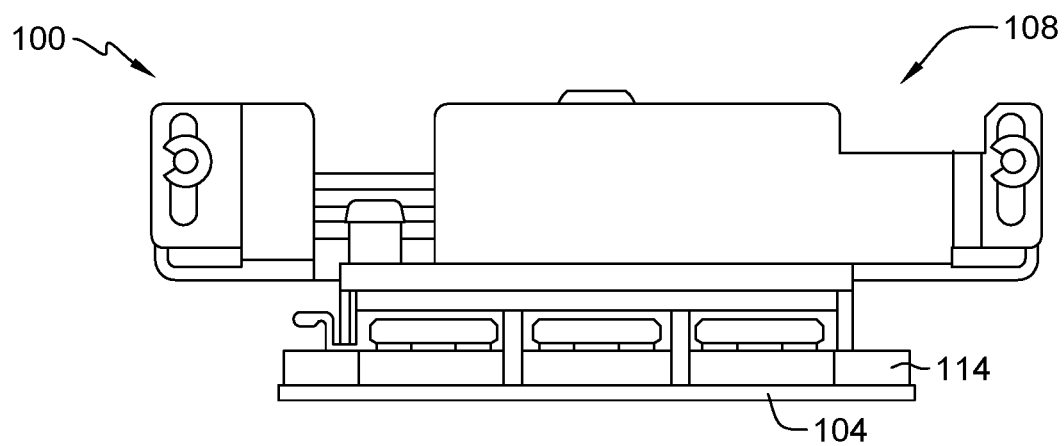
FIG. 3 is a side view of the structure perpendicular to the side view illustrate in FIG. 1 according to an exemplary embodiment.
Figure 4:
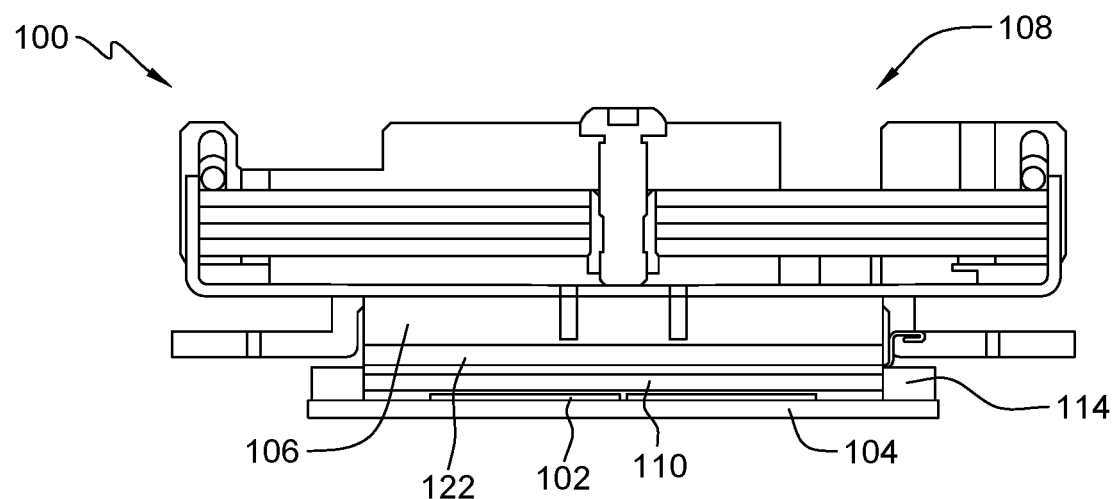
FIG. 4 is a cross-sectional view of the structure illustrated in FIG. 3 according to an exemplary embodiment.
Figure 5:
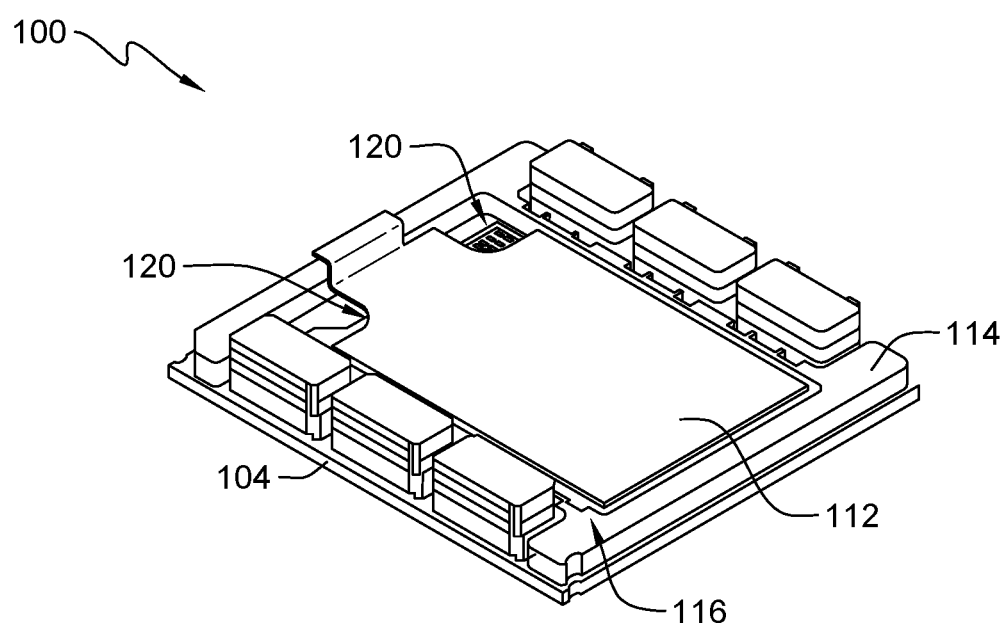
FIG. 5 is an isometric view of the structure illustrated in FIGS. 1-4 according to an exemplary embodiment.

Referring to FIGS. 1-5 multiple views of an electronic assembly 100 are shown according to an exemplary embodiment. FIG. 1 is an orthogonal side view of the electronic assembly 100, and FIG. 2 is a cross section view of FIG. 1. FIG. 3 is an orthogonal side view of the electronic assembly 100, and FIG. 4 is a cross section view of FIG. 3. FIGS. 3 and 4 are perpendicular to the views of FIGS. 1 and 2. Finally, FIG. 5 is an isometric view of the electronic assembly 100.

The electronic assembly 100 includes a module assembly (hereinafter "module") removably attached to a socket (or receptacle, such as, for example, LGA-type or BGA connector) on a processor board 104. The module is secured to the processor board 104 and held in place by a pressure plate 106, load hardware 108 and one or more spring loaded clamps or latches. The pressure plate 106 and the load hardware 108 apply a uniform load (force) on the module to ensure adequate electrical connectivity between the module and the processor board 104 as well as maintain a sufficient physical connection between the various components to ensure optimal thermal connectivity.

The module, alternatively processor package or multichip module (MCM), may include one or more electronic components 102 secured to a laminate. The one or more electronic components 102 mounted to the laminate may include one or more of the following: application-specific integrated circuits (ASICs), several hybrid memory cubes (HMCs), dynamic random-access memory (DRAM) chips, trusted platform modules (TPMs), flash memory, ARM processors, Serial (PC) Electrically Erasable Programmable Read Only Memory (SEEPROM), and capacitors. Typically, those devices or components having/requiring have the highest power dissipation densities are located closest to the cooling apparatus.

In conventional assemblies, the pressure plate 106 would evenly distribute the load (force) from the load hardware 108 to a lid of a module; however, according to embodiments of the present invention the pressure plate 106 and the load hardware 108 apply a uniform load directly to the electronic components 102, specifically a processor, without a lid. Therefore, eliminating the module lid improves thermal performance of assembly by eliminating one of the TIM interfaces.

The electronic assembly 100 further includes a cooling apparatus 110, or liquid cold plate, held in place by a rotating cover 112. The rotating cover 112 is rotatably secured at a first end to the processor board 104, or other surrounding structures attached to the processor board 104, such as for example, a top frame 114. In some embodiments, the top frame 114 completely surrounds all sides of the electronic components 102 and the installed cooling apparatus 114 and provides structural support to the laminate to resist flexing and warping which can damage the electronic assembly 100 or damage the electronic components 102 themselves. In general, the rotating cover 112 has an open position and a closed position. In the open position, the rotating cover 112 is lifted at a second end, opposite the first end, to some angle. In some embodiments, a handle or lip may be integrated into the second end of the rotating cover 112 to facilitate lifting to the open position. In contrast, the rotating cover 112 is in the closed position when it lays down flat substantially parallel with the processor board 104. It should be noted, the rotating cover 112 must be held in an open position and will not remain open on its own. Further, the rotating cover 112 may be in the closed position with or without a module installed on the processor board 104. As such, the electronic assembly 100 includes some form of mechanical stop preventing the rotating cover 112 from opening beyond about 45 degrees to 60 degrees. In all cases, the rotating cover 112 is physically prevented from opening beyond any degree which would allow the rotating cover 112 to remain in the open position without being held open.

The rotating cover 112 further includes pivot features 116 for rotatably securing the first end of the rotating cover 112 to the top frame 114. The pivot features 116 may include any mechanism which will allow the rotating cover to rotate open. In a preferred embodiment, the pivot features 116 must allow the rotating cover to float in a vertical direction to accommodate optimal alignment and contact with the electronic components 102, specifically any processors or chips, as is described in more detail below. In some embodiments, pivot features 116 may include pins on the rotating cover 112 which engage with corresponding holes in the top frame 114 to provide the necessary rotating motion.

The rotating cover 112 further includes alignment features 118 for receiving and loosely holding the cooling apparatus 110 in place. In some embodiments, the alignment features 118 include channels formed in opposite sides adjacent to the first and second ends. The channels would be formed downward such that an underside of the rotating cover 112 remains open and the top of the rotating cover 112 is solid. In such cases, the channels of the rotating cover 112 will capture, and loosely support, the cooling apparatus 110 along opposite edges. In all cases, the alignment features 118, channels or otherwise, would not interfere with any of the electronic components 102. In other words, a length and width of the electronic components 102 (ie processor) would fit between the channels on the underside of the rotating cover 112. Both the rotating cover 112 and the channels would preferably be fabricated from a single material, for example, metal. The rotating cover 112 may alternatively be fabricated from stainless steel, steel or aluminum. In some embodiments, the thermal conductivity of the rotating cover 112 may be considered, in other cases it may not. In some embodiments, the channels run the full length of the rotating cover 112. In other cases, the channels do not run the full length of the rotating cover 112. For example, the channels may run only 50% or 60% of the length. In all cases the alignment features 118, for example the channels, must extend along the length of the rotating cover 112 long enough to support the cooling apparatus 110 and prevent it from falling out once installed. According to some embodiments, the alignment features 118 may include two or more u-shaped features or clips extending downward on the underside of the rotating cover 112. Like the channels, both the rotating cover 112 and the u-shaped features would preferably be fabricated from a single material, for example, metal. Like above, the cooling apparatus 110 fits loosely in the alignment features 118 and is allowed to float to accommodate optimal alignment and contact with the module, as is described in more detail below.

The rotating cover 112 further includes a closure mechanism for securing it in the closed position. The closure mechanism may include any latch, catch, pin or detent sufficient to secure the rotating cover in the closed position with the cooling apparatus 110 installed. Although little or no force is expected to be required to close the rotating cover 112, such closure mechanisms will positively indicate to an operator or maintenance personnel the rotating cover 112 is closed and ready for a load to be applied by the load hardware 108. In some cases, the closure mechanism may further provide a visual indication to an operator or maintenance personnel the rotating cover 112 is closed and ready for a load to be applied by the load hardware 108.

The rotating cover 112 further includes relief cuts 120, or openings, corresponding to inlet/outlet ports of the cooling apparatus 110. In the present embodiment, the inlet/outlet ports of the cooling apparatus are both arranged at one end of the cooling apparatus 110 and correspond with the relief cuts 120 in the rotating cover 112. When the cooling apparatus 110 is installed in the rotating cover 112, the inlet/outlet ports will protrude through the relief cuts 120.

Alternately, the relief cuts 120 in the rotating cover 112 may be positioned anywhere to accommodate a different cooling apparatus having a different configuration of inlet/outlet ports. In all cases, any relief cuts in the rotating cover 112 cannot undermine its ability to receive and support a cooling apparatus, for example the cooling apparatus 110, as described in detail above. In the present embodiment, the cooling apparatus 110 is slid in a linear direction into the rotating cover 112, and thus the inlet/outlet port configuration in conjunction with any relief cuts in the rotating cover 112 must allow such engagement between the cooling apparatus 110 and the rotating cover 112. Furthermore, the cooling apparatus and associated relief cuts should be selected and positioned careful such as not to unnecessarily expose the most sensitive components of the module, for example processors or chips which are typically located at or near a center of the module.

Referring to FIGS. 6-9 multiple cross-section views of the electronic apparatus 100 are shown in operation according to embodiments of the present invention. Specifically, FIGS. 6-9 illustrate the use, functionality, and advantages of the rotating cover 112.

Figure 6:
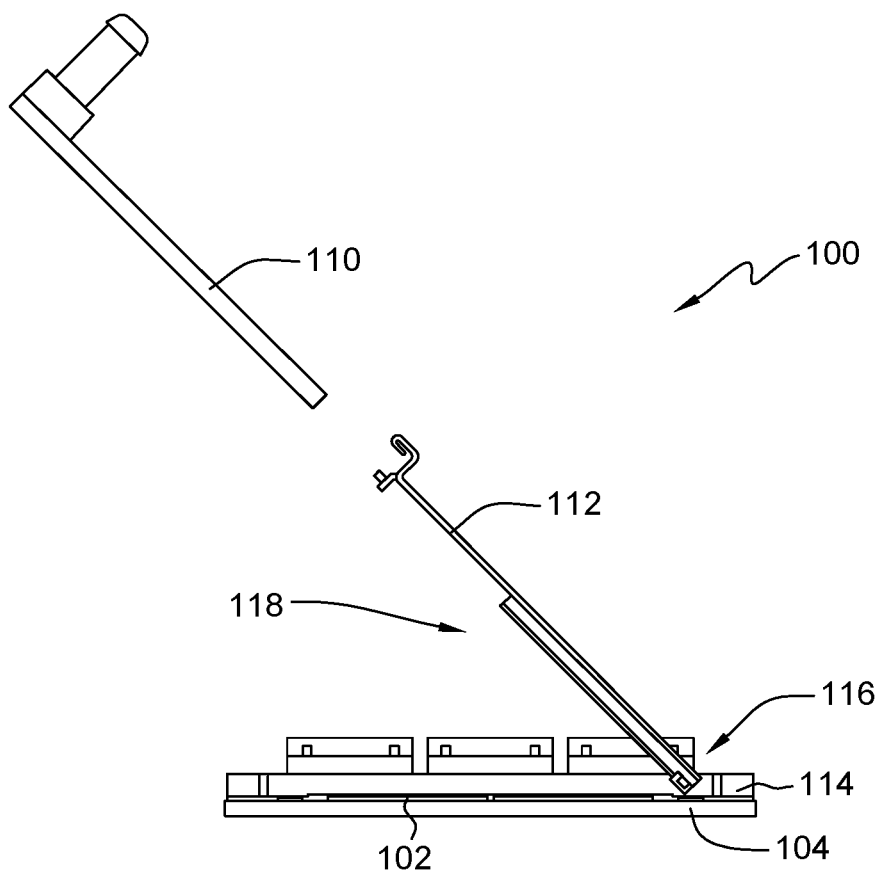
FIG. 6 is a cross-sectional view of the structure illustrated in FIG. 3 according to an exemplary embodiment.

Referring to FIG. 6 the rotating cover 112 is lifted from the close position into the open position, and held open by an operator. Next, the module is inserted into the socket or receptacle on the processor board 104. According to the embodiment illustrated in FIG. 6, the alignment features 118 do not run the full length of the rotating cover 112. Instead, the alignment features 118 illustrated in FIG. 6 extend approximately 60% of the length of the rotating cover 112 beginning at about the first end adjacent the pivot features 116. Also shown in FIG. 6, the opening position of the rotating cover 112 is limited to about 45 degrees.

Figure 7:
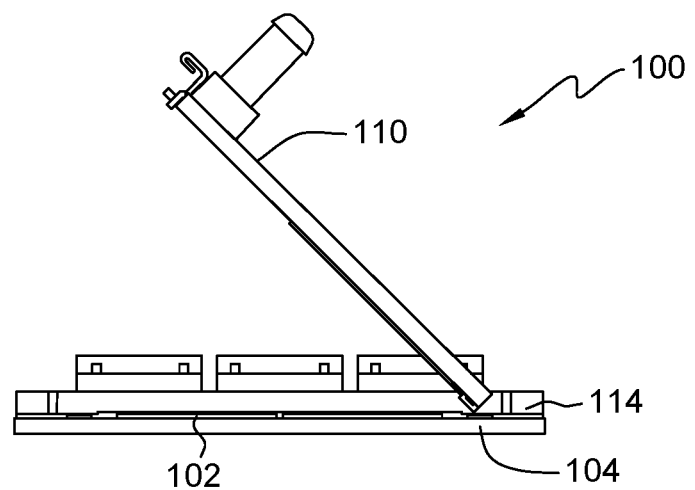
FIG. 7 is a cross-sectional view of the structure illustrated in FIG. 3 according to an exemplary embodiment.

Referring to FIG. 7 the cooling apparatus 110 is slid into the rotating cover 112. Specifically, the cooling apparatus 110 engages with, and is held in place by the alignment features 118 of the rotating cover 112. Before the rotating cover 112 is closed, a thermal interface material is applied to the top of the electronic components 102, if not already present.

Figure 8:
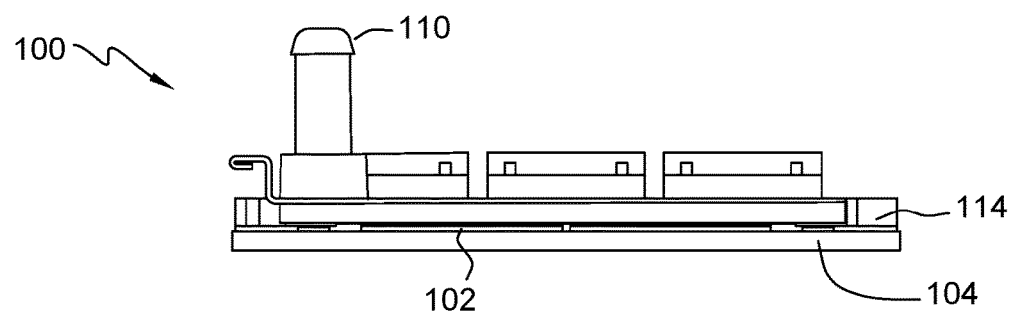
FIG. 8 is a cross-sectional view of the structure illustrated in FIG. 3 according to an exemplary embodiment.

Referring to FIG. 8 the rotating cover 112 is secured in the closed position. Doing so generally requires little or no force to engage a catch or detent. In all cases, any catch or detent will positively indicate to the operator the rotating cover 112 is in the closed position and ready for a load 124 to be applied. Once the rotating cover 112 is closed, the thermal interface material is sandwiched between and directly contacts the electronic components 102 (ie processors) and the cooling apparatus 110. The thermal interface material located between electronic components 102 and the cooling apparatus 110 operates as a single TIM interface which is a key benefit of the present invention.

Figure 9:
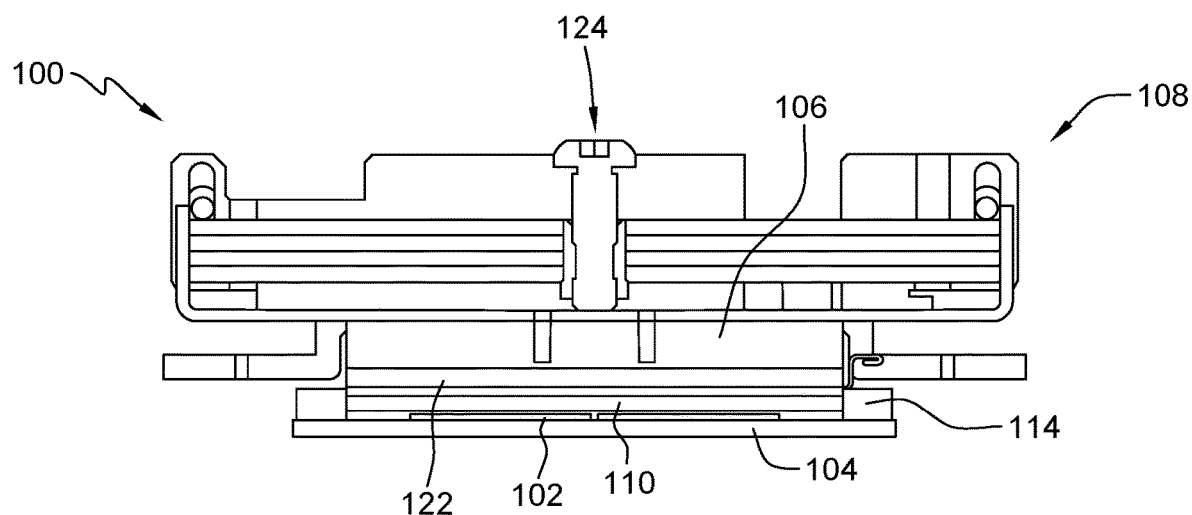
FIG. 9 is a cross-sectional view of the structure illustrated in FIG. 3 according to an exemplary embodiment.

Referring to FIG. 9 Once the rotating cover 112 is secured in the closed position, an elastomer 122 followed by the pressure plate 106 are placed on top of the rotating cover 112. The elastomer 122 is positioned, or sandwiched, between the load hardware 108 and the rotating cover 112 to evenly distribute the load 124 and maintain adequate thermal contact between the electronic components 102 and the cooling apparatus 110. The elastomer 122 can be any heat resistant elastomeric material known to person of ordinary skill in the art, such as, for example, Neoprene, EPDM and Viton rubbers. In some cases, portions of the elastomer 122 or other elastomers may also be placed on other surrounding components of the electronic apparatus 100 at the same time. Finally, the load hardware 108 is place on top of the pressure plate 106 and the load 124 is applied. In some embodiments, the load hardware 108, the cooling apparatus 110, and any elastomer (122) may be a single integrated assembly, rather than the individual components described above.

Importantly, as previously discussed above, the rotating cover 112 must float vertically to ensure solid load transmission from load hardware 108 through elastomer 122 to the cooling apparatus 110 and finally the electronic components 102. Solid load transmission is critical to ensure adequate physical contact between the electronic components 102, the TIM interface, and the cooling apparatus 110 to produced optimal thermal conduction necessary to cool the electronic components 102. A such, the pivot features 116 enable the rotating cover 112, together with the cooling apparatus 110, to float in a vertical direction and be unrestricted when the load 124 is applied by the load hardware 108. Stated differently, once in the closed position, the rotating cover 112 is held in place by the cooling apparatus 110 and the pressure plate 106 such that the pivot features 116 are disengaged and do not influence a vertical position or alignment of the rotating cover.

Also as previously described, the cooling apparatus 110, held by the alignment features 118, must also float, at least vertically. Specifically, the size, shape and dimensional tolerance of the alignment features 118 must allow the cooling apparatus 110 to float, at least, in a vertical direction and be unrestricted by the rotating cover 112 when the load 124 is applied by the load hardware 108. In all cases, the rotating cover 112 cannot interfere with applying the load 124 and cannot restrict or obstruct adequate thermal contact between the cooling apparatus 110 and the electronic components 102.

As will be appreciated by persons having ordinary skill in the art, embodiments of the present invention make cooling the module with only a single TIM interface possible. Unlike current solutions, only one TIM interface will separate the electronic components 102 from the cooling apparatus 110. The single TIM interface improves cooling performance and efficiency, and thereby meets the anticipated cooling demands of high-performance future systems. More specifically, the proposed configuration described herein will improve cooling performance by at least 25% and eliminate the need for performance throttling of the electronic components 102 to manage heat.

Embodiments of the present invention further improve ease of module installation and replacement while simultaneously providing necessary protection to the electronic components 102 (ie processors) during module installation and replacement. Specifically, the electronic components 102 are protected by the fact that the rotating cover 112 can never be left open. In all cases the open position, or angle, of the rotating cover 112 is limited to avoid unnecessarily exposing the electronic components 102 and thus preventing them from being damaged by dropped tools or otherwise.

Figure 10:
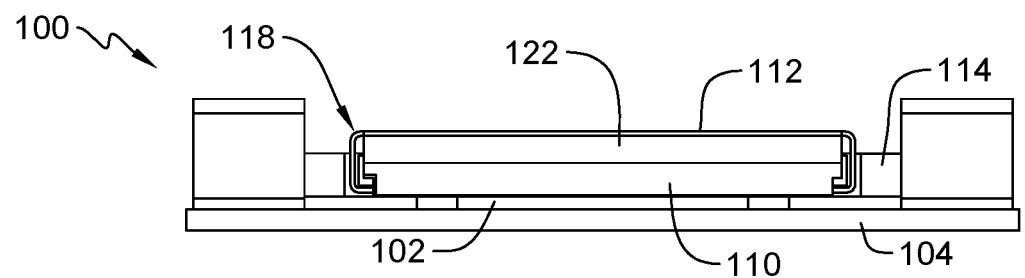
FIG. 10 is a cross-sectional view of an electronic structure according to an exemplary embodiment.
Figure 11:
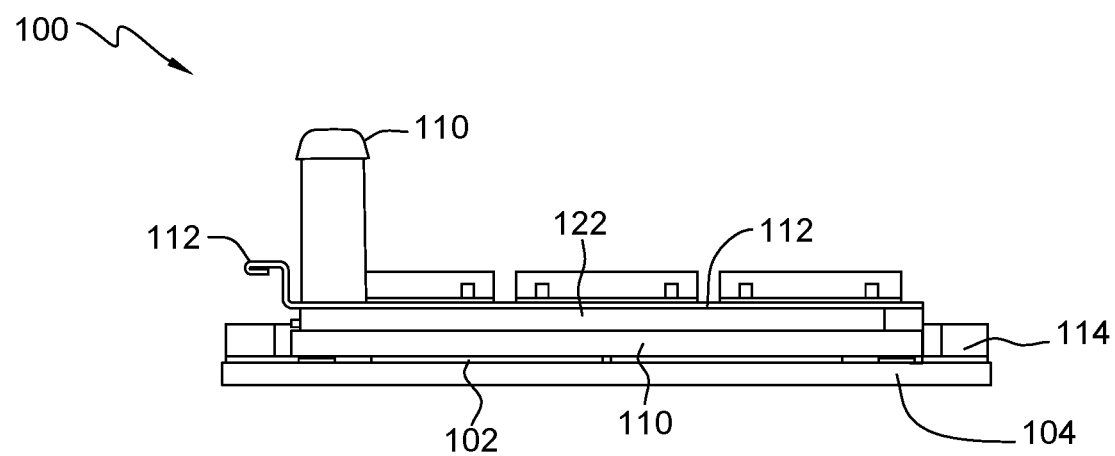
FIG. 11 is a cross-sectional view of an electronic structure according to an exemplary embodiment.

Referring to FIGS. 10-11 the electronic apparatus 100 is shown according to an alternative embodiment. In such embodiments, the elastomer 122 is positioned between the rotating cover 112 and the cooling apparatus 110, rather than on top of the rotating cover 112 as described above. Doing so further improves uniform contact between the electronic components 102 and the cooling apparatus 110 by eliminating foreign objects and debris from interfering with the contact between an upper surface of the cooling apparatus 110 and an underside of the rotating cover 112. Foreign objects and debris between the cooling apparatus 110 and the rotating cover 112 may cause uneven, or nonuniform, contact between the cooling apparatus 110 and the electronic components 102, thereby degrading thermal efficiency of the system. It is noted that the alignment features 118 of the rotating cover 112 of the present embodiment must be larger to accommodate the additional combined thickness of the elastomer 122 and the cooling apparatus 110.

Figure 12:
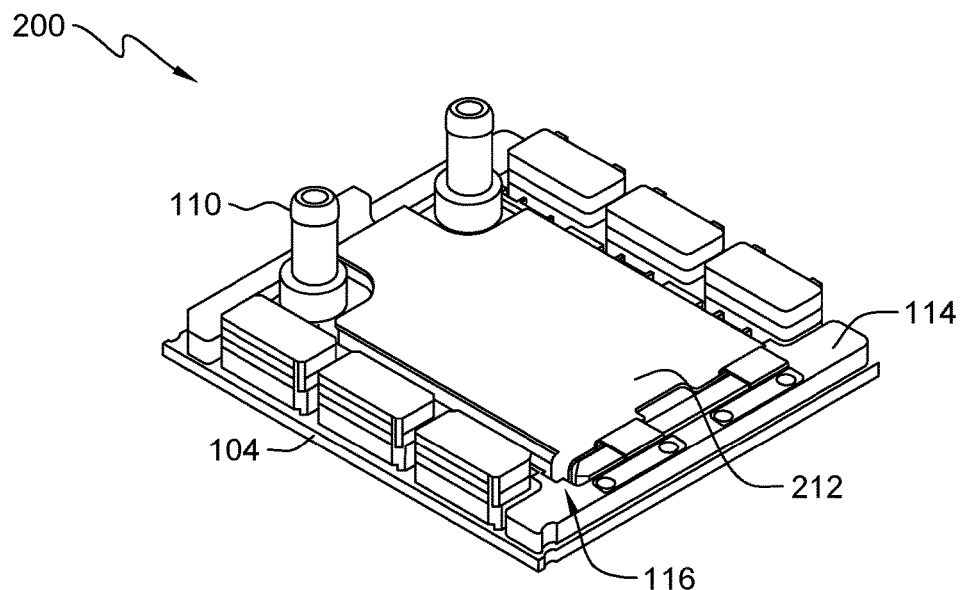
FIG. 12 is an isometric view of an electronic structure according to an exemplary embodiment.
Figure 13:
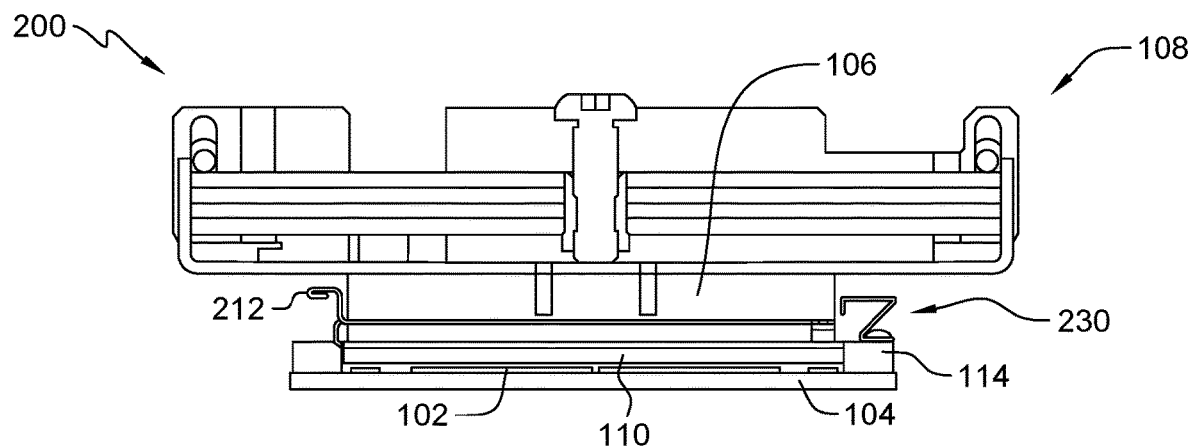
FIG. 13 is a cross-sectional view of the structure illustrated in FIG. 12 according to an exemplary embodiment.

Referring to FIGS. 12-13 an electronic apparatus 200 is shown according to an alternative embodiment. The electronic assembly 200 of the present embodiment is substantially similar in all aspects to the electronic assembly 100 described above; however, with a different rotating cover configuration. Specifically, the cooling apparatus 110 of the electronic assembly 200 is held in place by a rotating cover 212. Like the rotating cover 112, the rotating cover 212 is also rotatably secured at a first end to the processor board 104, or other surrounding structures attached to the processor board 104, such as, for example, the top frame 114. Unlike the rotating cover 112, the open position of the rotating cover 212 is greater than or equal to 90 degrees. The larger opening angle enables straight-in access for easier serviceability as compared to the limited opening angle of the rotating cover 112 described above. Because the rotating cover 212 opens at least 90 degrees and the module and cooling apparatus 110 can be installed straight-in, the rotating cover 212 does not include any alignment features to hold the cooling apparatus 110 as described above with respect to the rotating cover 112. Instead, any alignment features may be integrated into the top frame 114 and used to align and position the cooling apparatus 110.

In the present embodiment, the rotating cover 212 is fitted with closure springs 230. In such cases, the rotating cover 212 must be held in an open position and will not remain open on its own. In some embodiments, the electronic assembly 200 includes some form of mechanical stop preventing the rotating cover 212 from opening beyond about 100 to about 125 degrees to ensure the rotating cover 212 cannot remain in the open position on its own. In some instances, the closure springs 230 may function as the mechanical stop.

Figure 14:
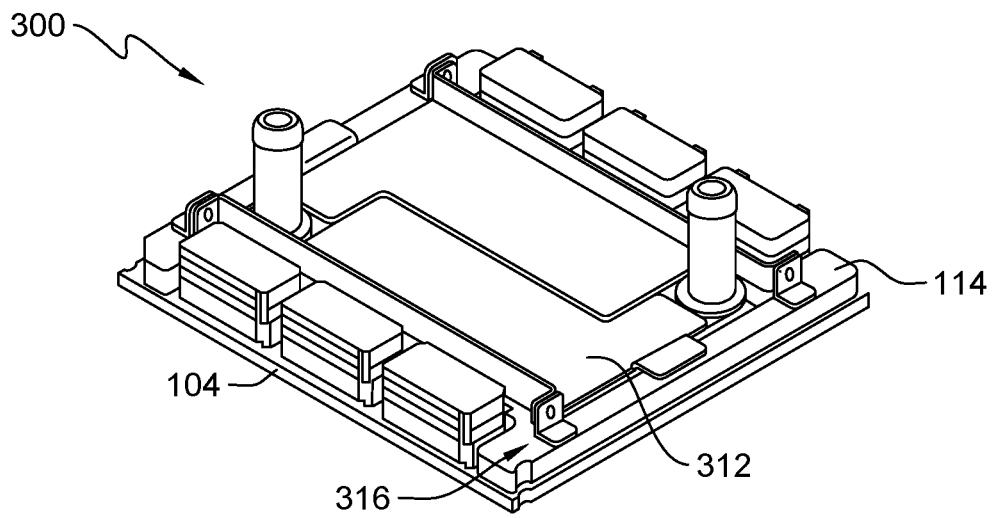
FIG. 14 is an isometric view of an electronic structure according to an exemplary embodiment.
Figure 15:
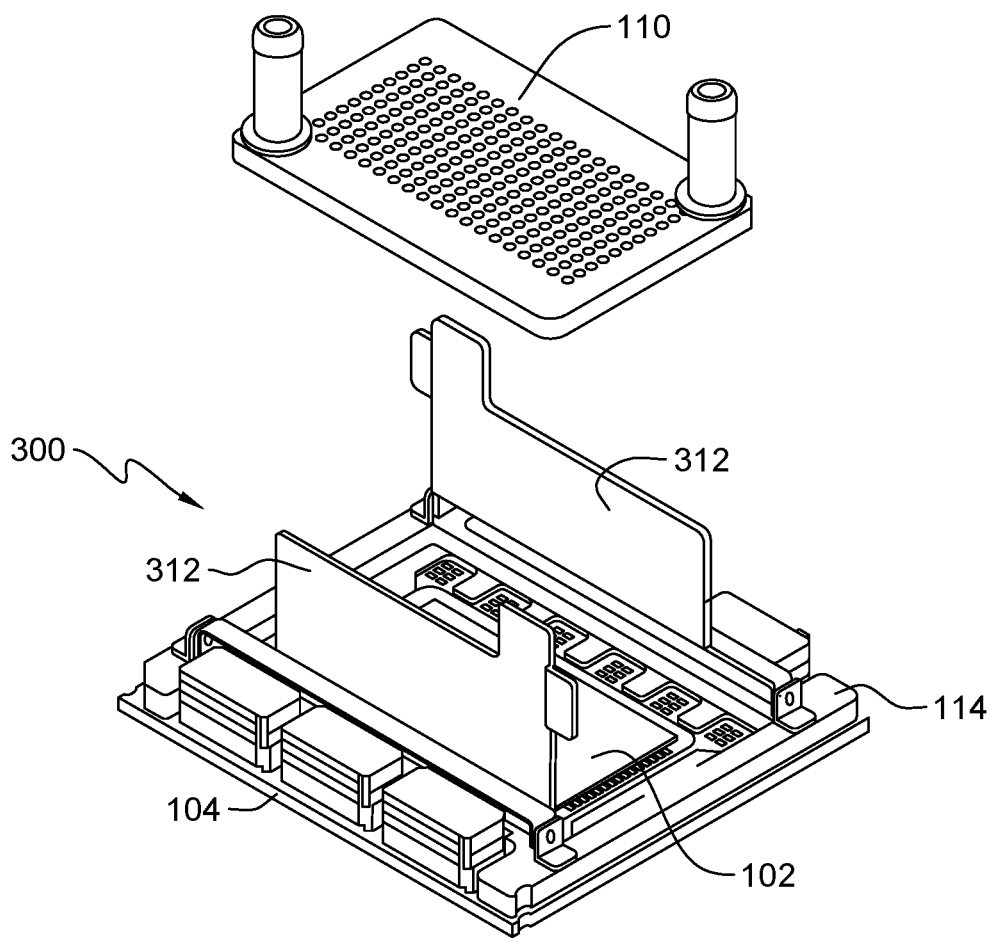
FIG. 15 is an isometric view of an electronic structure according to an exemplary embodiment.

Referring to FIGS. 14-15 an electronic apparatus 300 is shown according to an alternative embodiment. The electronic assembly 300 of the present embodiment is substantially similar in all aspects to the electronic assembly 100 described above; however, with a different rotating cover configuration.

The cooling apparatus 110 of the electronic assembly 300 is held in place by a rotating cover 312. The rotating cover 312 is rotatably secured to the processor board 104, or other surrounding structures attached to the processor board 104, such as, for example, the top frame 114. Rather than a single cover like described above, the rotating cover 312 includes multiple rotating sections or doors.

The rotating cover 312 having multiple sections may be used to accommodate different cooling apparatuses (110) having various configurations. For example, the inlet/outlet ports of the cooling apparatus 110 shown in FIGS. 14 and 15 are arranged on opposite corners of the cooling apparatus 110, and such a configuration is incompatible with the rotating covers 112/212 described above. As such, the two sections of the rotating cover 312 uniquely accommodate the alternate inlet/outlet port configuration.

As shown in FIGS. 14 and 15, the rotating cover 312 includes two rotating sections rotatably secured on opposite sides of the top frame 114. In some embodiments, the rotating cover 312 may include more than two sections, for example, four sections each rotatably secured from each side of the top frame 114. The rotating cover 312 including multiple sections enables straight-in access enabling easier serviceability as compared to the angled access of the rotating cover 112 described above.

Like above, the rotating cover 312 has an open position and a closed position. In the open position, both sections of the rotating cover 312 are lifted to some angle to allow for installation of the module. According to an embodiment, the rotating cover 312 is configured where each section can open to an angle greater than 90 degrees such that each section will remain open without the need to be held in the open position by an operator. In some embodiments, a handle or lip may be integrated into each section of the rotating cover 312 to facilitate lifting to the open position. The rotating cover 312 is in the closed position when it lays down flat substantially parallel with the processor board 104. Both sections of the rotating cover 312 are manually opened and manually closed. Unlike the rotating cover 112/212 described above, each section of the rotating cover 312 can remain in the open position and does not require the operator to hold them in the open position. Similar to the rotating cover 112, each section of the rotating cover 312 may be in the closed position with or without a module installed on the processor board 104. In some embodiments, the rotating cover 312 may be fitted with springs used to automatically close each section. In such cases, each section of the rotating cover 312 must be held in an open position and will not remain open on their own.

The rotating cover 312 further includes pivot features 316 for rotatably securing each section to the top frame 114. The pivot features 316 are substantially similar to the pivot features 116 described above; however, may be configured differently to accommodate for the multiple sections of the rotating cover 312. Most importantly, the pivot features 316 must allow each section of the rotating cover 312 to float in a vertical direction to accommodate optimal alignment and contact with the electronic components 102, as was described in detail above. Unlike the rotating cover 112 described above, the rotating cover 312 does not include any alignment features to hold the cooling apparatus 110. Instead, positioning the cooling apparatus 110 is accomplished by the top frame 114. The rotating cover 312 further includes a closure mechanism for securing it in the closed position substantially similar to the closure mechanism described above.

In operation, both sections of the rotating cover 312 are lifted from the closed position to the open position. Next, the module is inserted into the socket or receptacle on the processor board 104, and a thermal interface material is applied to the top of the electronic components 102, if not already present. Next, the cooling apparatus 110 is placed on top of the module, specifically on top of the electronic components 102 (ie processors). In the present embodiment, the cooling apparatus 110 is automatically aligned and positioned by the open sections of the rotating cover 312 and adjacent portions of the top frame 114. In other words, the top frame 114 surrounds the cooling apparatus 114 once installed. Alternatively, alignment features may be integrated into the top frame 114 and used to align and position the cooling apparatus 110.

After the cooling apparatus 110 is installed, both sections of the rotating cover 312 are moved from the open position to the closed position. Like above, a catch or detent will positively indicate to the operator both sections of the rotating cover 312 are in the closed position and ready for a load 124 to be applied. Once the rotating cover 312 is closed, the thermal interface material is sandwiched between and directly contacts the electronic components 102 (ie processors) and the cooling apparatus 110. The thermal interface material located between the electronic components 102 and the cooling apparatus 110 operates as a single TIM interface which is a key benefit of the present invention. After securing the rotating cover 312 in the closed position, an elastomer (as described above) followed by the pressure plate 106 are placed on top of the rotating cover 312. Finally, the load hardware 108 is place on top of the pressure plate 106 and a load is applied.

Also, as previously discussed above, both sections of the rotating cover 312 must float vertically to ensure solid load transmission from load hardware 108 through elastomer to the cooling apparatus 110 and finally the electronic components 102 of the module. In all cases, the rotating cover 312 cannot interfere with applying the load and cannot restrict or obstruct adequate thermal contact between the cooling apparatus 110 and the electronic components 102. Like above, the single TIM interface improves cooling performance and efficiency, and thereby meets the anticipated cooling demands of high-performance future systems.

Figure 16:
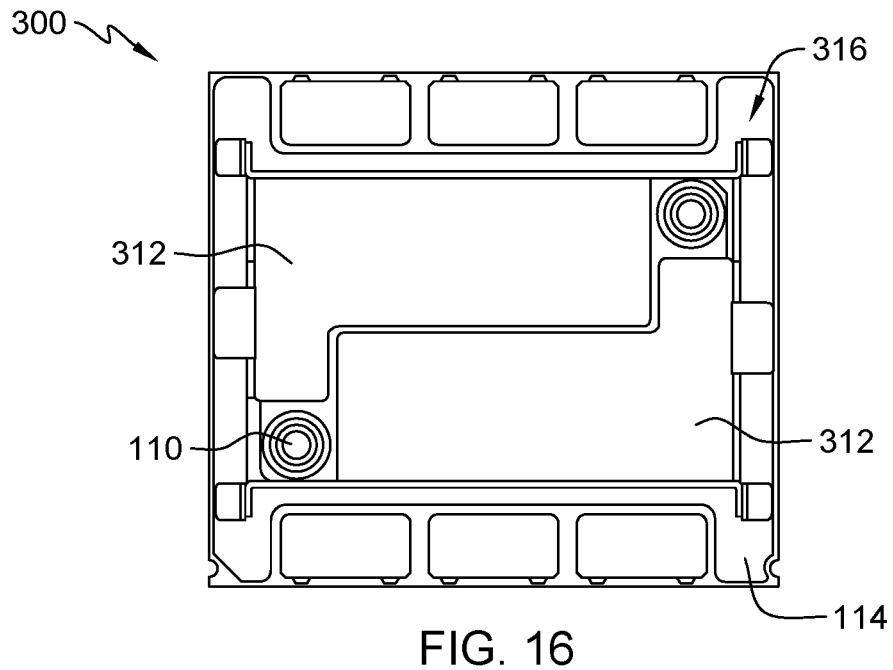
FIG. 16 is a top view of an electronic structure according to an exemplary embodiment.

Referring to FIG. 16 a top view of the electronic apparatus 300 is shown. The sections of the rotating cover 312 are symmetrical, each being substantially similar size and shape. It should be noted the seam or boundary between each section illustrated in FIG. 16 is non-linear. Stated differently, the seam between each section is not a straight line across the cooling apparatus 110. Instead, the seam between each section includes two turns, illustrated as right angle turns but not mandatory. The non-linear seam causes both sections of the rotating cover 312 to act in concert once the load is applied. Doing so produces a more uniform pressure on the cooling apparatus 110 and thus results in more uniform contact between the cooling apparatus 110 and the electronic components 102.

Unlike the rotating cover 112 described above, the rotating cover 312 does not require the relief cuts (120) corresponding to inlet/outlet ports of the cooling apparatus 110. Instead, the size and shape of each section of the rotating cover 312 is specifically designed to accommodate the inlet/outlet port configuration of the cooling apparatus 110, as illustrated.

Figure 17:
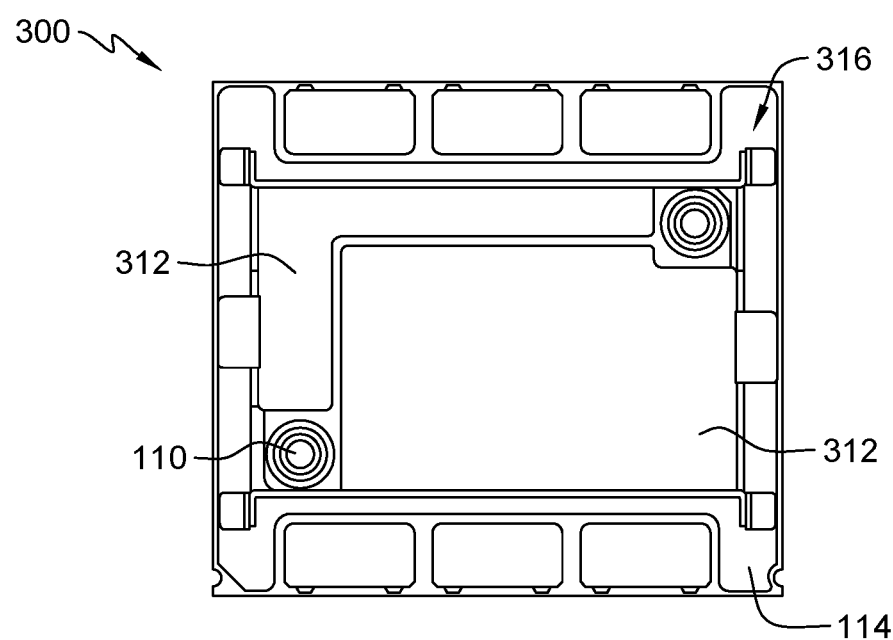
FIG. 17 is a top view of an electronic structure according to an exemplary embodiment.

Referring to FIG. 17 a top view of the electronic apparatus 300 is shown according to an alternative embodiment. Unlike the sections illustrated in FIG. 16, the sections of the rotating cover 312 of FIG. 17 are not symmetrical. Instead one section is larger than the other, each being a different shape. Despite being different shapes, the two sections of the present embodiment have complimentary shapes such that a majority of the cooling apparatus 110 is covered when in the closed position. Like above, the seam between each section illustrated in FIG. 17 is also non-linear, but with only a single right-angle turn. Such a configuration is particularly advantageous because the most sensitive components, for example processors or chips, are located in the center of the module. As such, the seam between each section of the rotating cover illustrated in FIG. 16 would leave a small opening that directly expose the tops of the chips. Unlike the rotating door configuration illustrated in FIG. 16, the seam between each section of the rotating cover illustrated in FIG. 17 is offset from a center of the module and thus offers better physical protection to the chips.

According to an embodiment, the larger section is spring loaded and closes on its own, while the smaller section is not spring loaded and can remain open on its own. As discussed previously, the spring-loaded larger section will providing necessary protection to the module during installation and replacement. Specifically, the module is protected by the fact that the larger section of the rotating cover 312 can never be left open.

In yet another embodiment, an elastomer is positioned between the rotating cover 312 and the cooling apparatus 110, rather than on top of the rotating cover 112 as described above. It is noted that the pivot features 316 must be configured to accommodate the additional thickness of the elastomer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An electronic assembly comprising:
   an electronic module mounted to a laminate;
   a rotating cover rotatably attached directly to a top frame secured to the laminate, wherein the rotating cover comprises an open position and a closed position, wherein the rotating cover comprises a solid surface extending over an entirety of a topmost surface of a substantial portion of the electronic module in the closed position; and
   a cooling apparatus demountably secured to the rotating cover and disposed below the rotating cover and directly above the module.

2. The electronic assembly according to claim 1, wherein the rotating cover is held in the closed position only by a load hardware such that pivot features of the rotating cover are disengaged and do not influence a vertical position of the rotating cover.

3. The electronic assembly according to claim 1, wherein pivot features of the rotating cover are disengaged and do not influence a vertical position of the rotating cover in the closed position.

4. The electronic assembly according to claim 1, wherein the cooling apparatus is a liquid cold plate comprising an inlet port and an outlet port, wherein the inlet port and the outlet port protrude through openings in a top surface of the rotating cover.

5. The electronic assembly according to claim 1, wherein the cooling apparatus is demountable from the rotating cover only in the open position, wherein the rotating cover is at an angle relative to a topmost surface of the electronic module in the open position, and wherein the rotating cover is substantially parallel with a topmost surface of the electronic module in the close position.

6. The electronic assembly according to claim 1, further comprising:
   a pressure plate entirely above and contacting the rotating cover; and
   load hardware above and directly contacting the pressure plate.

7. The electronic assembly according to claim 6, further comprising:
   an elastomer sandwiched between the rotating cover and the pressure plate.

8. An electronic assembly comprising:
   an electronic module mounted to a laminate;
   a rotating cover rotatably attached directly to a top frame secured to the laminate, wherein the rotating cover comprises an open position and a closed position, wherein the rotating cover comprises a solid surface extending over an entirety of a topmost surface of a substantial portion of the electronic module in the closed position;
   a mechanical stop preventing the rotating cover from rotating beyond 60 degrees relative to a top surface of the electronic module in the open position; and
   a cooling apparatus demountably secured to the rotating cover and disposed below the rotating cover and directly above the module.

9. The electronic assembly according to claim 8, wherein the rotating cover is held in the closed position only by a load hardware such that pivot features of the rotating cover are disengaged and do not influence a vertical position of the rotating cover.

10. The electronic assembly according to claim 8, wherein pivot features of the rotating cover are disengaged and do not influence a vertical position of the rotating cover in the closed position.

11. The electronic assembly according to claim 8, wherein the cooling apparatus is a liquid cold plate comprising an inlet port and an outlet port, wherein the inlet port and the outlet port protrude through openings in a top surface of the rotating cover.

12. The electronic assembly according to claim 8, wherein the cooling apparatus is demountable from the rotating cover only in the open position, wherein the rotating cover is at an angle relative to a topmost surface of the electronic module in the open position, and wherein the rotating cover is substantially parallel with a topmost surface of the electronic module in the close position.

13. The electronic assembly according to claim 8, further comprising:
   a pressure plate entirely above and contacting the rotating cover; and load hardware above and directly contacting the pressure plate.

14. The electronic assembly according to claim 13, further comprising:
an elastomer sandwiched between the rotating cover and the pressure plate.

15. An electronic assembly comprising:
an electronic module mounted to a laminate;
a rotating cover rotatably attached directly to the laminate with pivot features, wherein the rotating cover comprises alignment channels extending from a pivot axis and disposed along opposite edges of the rotating cover; and
a cooling apparatus is disposed below the rotating cover and directly above the module, and wherein the cooling apparatus is demountably secured to the rotating cover by the alignment channels, wherein opposite edges of the cooling apparatus are captured on at least three surfaces by the alignment channels, and wherein the rotating cover comprises a solid surface extending over an entirety of a topmost surface of the electronic module in a closed position.

16. The electronic assembly according to claim 15, wherein the rotating cover is held in the closed position only by a load hardware such that pivot features of the rotating cover are disengaged and do not influence a vertical position of the rotating cover.

17. The electronic assembly according to claim 15, wherein pivot features of the rotating cover are disengaged and do not influence a vertical position of the rotating cover in the closed position.

18. The electronic assembly according to claim 15, wherein the cooling apparatus is a liquid cold plate comprising an inlet port and an outlet port, wherein the inlet port and the outlet port protrude through openings in a top surface of the rotating cover.

19. The electronic assembly according to claim 15, wherein the cooling apparatus is demountable from the rotating cover only in an open position, wherein the rotating cover is at an angle relative to a topmost surface of the electronic module in the open position, and wherein the rotating cover is substantially parallel with a topmost surface of the electronic module in the close position.

20. The electronic assembly according to claim 15, further comprising:
a pressure plate entirely above and contacting the rotating cover; and
load hardware above and directly contacting the pressure plate.

* * * * *